(12) United States Patent
Umahashi et al.

(10) Patent No.: US 7,438,286 B2
(45) Date of Patent: Oct. 21, 2008

(54) WORKPIECE HOLDING JIG

(75) Inventors: Takayuki Umahashi, Tokyo (JP); Ken Kimura, Tokyo (JP)

(73) Assignee: Disco Corporation, Tokyo (JP)

( * ) Notice: Subject to any disclaimer, the term of this patent is extended or adjusted under 35 U.S.C. 154(b) by 40 days.

(21) Appl. No.: 11/104,566

(22) Filed: Apr. 13, 2005

(65) Prior Publication Data

US 2005/0229914 A1  Oct. 20, 2005

(30) Foreign Application Priority Data

Apr. 20, 2004 (JP) ............................. 2004-123647

(51) Int. Cl.
*B25B 11/00* (2006.01)
(52) U.S. Cl. ..................... 269/21; 269/900; 269/903; 451/364
(58) Field of Classification Search ................ 269/21, 269/20, 900, 903; 451/364
See application file for complete search history.

(56) References Cited

U.S. PATENT DOCUMENTS 5,048,804 A * 9/1991 Ito ........................... 269/21
6,271,503 B1 * 8/2001 Hall et al. ................ 219/444.1
6,597,432 B2 * 7/2003 Ida ............................ 355/73
2006/0157905 A1 * 7/2006 Lenzini ..................... 269/21

FOREIGN PATENT DOCUMENTS

JP           2002-205298          7/2002

* cited by examiner

*Primary Examiner*—Lee D Wilson
(74) *Attorney, Agent, or Firm*—Smith, Gambrell & Russell, LLP

(57) ABSTRACT

A workpiece holding jig for holding a workpiece having a plurality of first dividing lines extending in a predetermined direction and a plurality of second dividing lines formed in a direction intersecting the plurality of first dividing lines on the workpiece holding table of a processing machine for cutting the workpiece along the plurality of first dividing lines and the plurality of second dividing lines, wherein the workpiece holding jig has a plurality of through-grooves corresponding to the plurality of first dividing lines and the plurality of second dividing lines formed on the workpiece, a plurality of suction-holes which are open at the top and formed at positions corresponding to a plurality of areas sectioned by the plurality of first dividing lines and the plurality of second dividing lines of the workpiece and suction-passages that are formed at positions where they do not intersect the plurality of through-grooves and connected to the plurality of suction-holes.

5 Claims, 13 Drawing Sheets

WORKPIECE HOLDING JIG

FIELD OF THE INVENTION

The present invention relates to a workpiece holding jig for holding a workpiece on the workpiece holding table of a processing machine such as a water jet-processing machine for cutting a workpiece such as a semiconductor wafer or the like by squirting a jet of high-pressure water thereto.

DESCRIPTION OF THE RELATED ART

In the production process of a semiconductor device, individual semiconductor chips are manufactured by forming a circuit such as IC or LSI in a large number of areas arranged in a lattice pattern on the front surface of a substantially disk-like semiconductor wafer and then, dicing the semiconductor wafer into the areas having each a circuit formed thereon along predetermined cutting lines called "streets". The thus divided semiconductor chips are packaged, and widely used in electric appliances such as cellular phones, personal computers or the like.

Lighter and smaller electric appliances such as cellular phones, personal computers or the like are now in demand, and packaging technologies called a "Chip Size Package (CSP)" that is capable of reducing the size of a semiconductor chip package have already been developed. As one of the CSP technologies, a packaging technology for producing a "Quad Flat Non-lead Package (QFN)" has been implemented. In this packaging technology called the QFN, a CSP substrate is manufactured by arranging a plurality of semiconductor chips in a matrix on a metal plate such as a copper plate, on which a plurality of connection terminals correspondent to the connection terminals of the semiconductor chips are formed and dividing lines for sectioning the semiconductor chips arranged in a lattice pattern are formed and by integrating the metal plate with the semiconductor chips through a resin portion formed by molding a resin, from the back surface side of the semiconductor chips. This CSP substrate is cut along the dividing lines to be divided into individual chip size packages (CSP).

The above CSP substrate is generally cut with a precision cutting machine called "dicing machine". This dicing machine comprises a cutting blade having an annular abrasive grain layer, and the CSP substrate is cut along the dividing lines to be divided into individual chip size packages (CSP) by moving this cutting blade relative to the CSP substrate along the dividing lines of the CSP substrate while the cutting blade is rotated. When the CSP substrate is cut with the cutting blade, however, a problem arises that burrs are formed on the connection terminals to cause a short circuit between adjacent connection terminals, thereby reducing the quality and reliability of a chip size package (CSP).

Further, when a workpiece such as a semiconductor wafer or the like besides the CSP substrate is cut with the cutting blade, a problem also occurs that fine chips are adhered to the surface of the workpiece, thereby contaminating the workpiece.

As a cutting technology for solving the above problems at the time of cutting with the cutting blade, for example, JP-A 2002-205298 discloses a water jet cutting processing technology for cutting a workpiece by squirting a jet of high-pressure water containing abrasive grains such as silica, garnet or diamond abrasive grains from a nozzle to the workpiece held by a workpiece holding means.

The above water jet cutting processing involves a problem that even though a protective sheet is affixed to the back surface of the workpiece such as a CSP substrate, processing water penetrates the protective sheet to cut the workpiece and consequently, the workpiece falls into pieces, thereby making it difficult to carry the workpiece successively. A similar problem occurs even in laser beam processing for cutting the workpiece by applying a laser beam thereto.

SUMMARY OF THE INVENTION

It is an object of the present invention to provide a workpiece holding jig capable of maintaining the form of a workpiece which does not fall into pieces when it is cut along predetermined dividing lines.

According to the present invention, the above object of the present invention is attained by a workpiece holding jig for holding a workpiece having a plurality of first dividing lines extending in a predetermined direction and a plurality of second dividing lines formed in a direction intersecting the plurality of first dividing lines on the workpiece holding table of a processing machine for cutting the workpiece along the plurality of first dividing lines and the plurality of second dividing lines, wherein the workpiece holding jig has a plurality of through-grooves corresponding to the plurality of first dividing lines and the plurality of second dividing lines formed on the workpiece, a plurality of suction-holes which are open at the top and formed at positions corresponding to a plurality of areas sectioned by the plurality of first dividing lines and the plurality of second dividing lines of the workpiece, and suction-passages that are formed at positions where they do not intersect the plurality of through-grooves, and connected to the plurality of suction-holes.

Preferably, adjacent through-grooves of the above plurality of through-grooves are interconnected at one ends and the other ends alternately.

The above workpiece holding jig comprises a holding jig body and a soft sheet mounted on the top of the holding jig body, the suction-passages are formed in the holding jig body, and the plurality of suction-holes are formed in the soft sheet. The holding jig body consists of a first jig plate and a second jig plate mounted on the top of the first jig plate, the suction-passages are formed in the first jig plate, and a plurality of suction-holes communicating with the suction-passages formed in the first jig plate and with the plurality of suction-holes formed in the soft sheet are formed in the second jig plate.

In the workpiece holding jig constituted according to the present invention, as areas sectioned by the first dividing lines and the second dividing lines of the workpiece are suction-held by the workpiece holding jig, when the workpiece is cut along the first dividing lines and the second dividing lines, it does not fall into pieces and can maintain its form, thereby making it easy to carry it subsequently.

DETAILED DESCRIPTION OF THE PREFERRED EMBODIMENTS

Preferred embodiments of a workpiece holding jig constituted according to the present invention will be further described in detail hereinunder with reference to the accompanying drawings.

Figure 1:
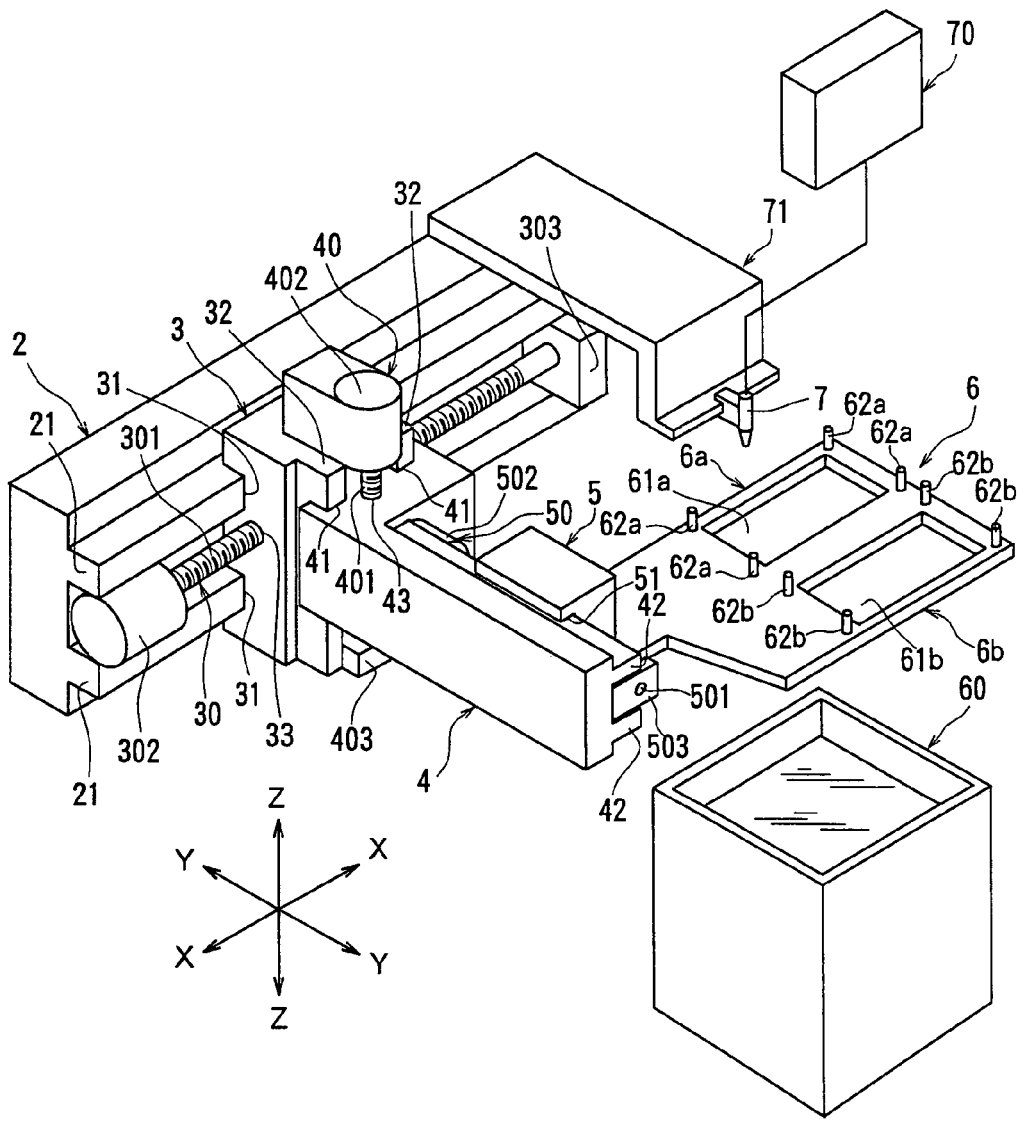
FIG. 1 is a perspective view of the principal section of a water jet-processing machine equipped with a workpiece holding jig constituted according to the present invention.

FIG. 1 is a perspective view of principal sections of a water jet-processing machine equipped with a workpiece holding jig constituted according to the present invention. The water jet-processing machine shown in FIG. 1 comprises a stationary base 2, a first movable base 3, a second movable base 4 and a third movable base 5. A pair of guide rails 21 and 21 extending parallel to each other in the direction indicated by an arrow X are formed on the flank on this side of the stationary base 2.

The first movable base 3 has a pair of to-be-guided grooves 31 and 31 that are formed in one flank opposed to the above stationary base 2 in the direction indicated by the arrow X and are slidably fitted to the pair of guide rails 21 and 21 provided on the stationary base 2, and a pair of guide rails 32 and 32 that are formed on the other flank and extend parallel to each other in the direction indicated by the arrow Z. By fitting the pair of to-be-guided grooves 31 and 31 to the pair of guide rails 21 and 21, the thus constituted first movable base 3 is supported onto the stationary base 2 in such a manner that it can move in the direction indicated by the arrow X. The water jet-processing machine in the illustrated embodiment comprises a first moving means 30 for moving the first movable base 3 along the pair of guide rails 21 and 21 provided on the above stationary base 2 in the direction indicated by the arrow X. The first moving means 30 has a male screw rod 301 arranged between the pair of guide rails 21 and 21 in parallel to them, and a pulse motor 302 for rotary-driving the male screw rod 301. The male screw rod 301 is screwed into a female screw 33 formed in the above first movable base 3, and one end thereof is rotatably supported onto a bearing member 303 fixed to the stationary base 2. The drive shaft of the pulse motor 302 is connected to the other end of the male screw rod 301 so that the first movable base 3 is moved along the pair of guide rails 21 and 21 formed on the stationary base 2 in the direction indicated by the arrow X by rotating the male screw rod 301 in a normal direction or reverse direction.

The above second movable base 4 has a pair of to-be-guided grooves 41 and 41 that are formed in one flank opposed to the above first movable base 3 in the direction indicated by the arrow Z and are slidably fitted to the pair of guide rails 32 and 32 provided on the first movable base 3, and a pair of guide rails 42 and 42 that are formed on a flank perpendicular to the above one flank and extend parallel to each other in the direction indicated by the arrow Y. By fitting the pair of guide groove 41 and 41 to the pair of guide rails 32 and 32, the thus constituted second movable base 4 is supported onto the first movable base 3 in such a manner that it can move in the direction indicated by the arrow Z. The water jet-processing machine in the illustrated embodiment comprises a second moving means 40 for moving the second movable base 4 along the pair of guide rails 32 and 32 on the first movable base 3 in the direction indicated by the arrow Z. The second moving means 40 has a male screw rod 401 arranged between the pair of guide rails 32 and 32 in parallel to them, and a pulse motor 402 for rotary-driving the male screw rod 401. The male screw rod 401 is screwed into a female screw 43 formed in the second movable base 4, and one end thereof is rotatably supported onto a bearing member 403 fixed to the first movable base 3. The drive shaft of the pulse motor 402 is connected to the other end of the male screw rod 401 so that the second movable base 4 is moved along the pair of guide rails 32 and 32 provided on the first movable base 3 in the direction indicated by the arrow Z by rotating the male screw rod 401 in a normal direction or reverse direction.

The above third movable base 5 has a pair of to-be-guided grooves.51 and 51 (only one upper groove is shown in FIG. 1) that are formed in one flank opposed to the above second movable base 4 in the direction indicated by the arrow Y and are slidably fitted to the pair of guide rails 42 and 42 provided on the above second movable base 4. The third movable base 5 is supported on the second movable base 4 in such a manner that it can move in the direction indicated by the arrow Y by fitting the pair of to-be-guided grooves 51 and 51 to the pair of guide rails 42 and 42. The water jet-processing machine in the illustrated embodiment comprises a third moving means 50 for moving the third movable base 5 along the pair of guide rails 42 and 42 provided on the above second movable base 4 in the direction indicated by the arrow Y. The third moving means 50 has a male screw rod 501 arranged between the pair of guide rails 42 and 42 in parallel to them, and a pulse motor 502 for rotary-driving the male screw rod 501. The male screw rod 501 is screwed into a female screw (not shown) formed in the above third movable base 5, and one end thereof is rotatably supported onto a bearing member 503 fixed to the second movable base 4. The drive shaft of the pulse motor 502 is connected to the other end of the male screw rod 501 so that the third movable base 5 is moved along the pair of guide rails 42 and 42 provided on the second movable base 4 in the direction indicated by the arrow Y by rotating the male screw rod 501 in a normal direction or reverse direction.

A workpiece holding table 6 constituting workpiece holding means is mounted to the other flank of the above third movable base 5. The workpiece holding table 6 has a first holding jig mounting portion 6a and a second holding jig mounting portion 6b both extending in the direction indicated by the arrow X in the illustrated embodiment. Rectangular openings 61a and 61b are respectively formed in the first holding jig mounting portion 6a and the second holding jig mounting portion 6b, and four positioning pins 62a and four positioning pins 62b are arranged to project from the top surface around the openings 61a and 61b, respectively. The water jet-processing machine in the illustrated embodiment has a water tank 60 that is installed below the workpiece holding table 6 and stores water for buffering a jet of water, which will be described later.

A nozzle 7 having a squirt hole having a diameter of about 200 μm for emitting a jet of water to workpieces held on the first holding jig mounting portion 6a and the second holding jig mounting portion 6b is arranged above the afore-mentioned workpiece holding table 6. This nozzle 7 is supported onto a nozzle support member 71 fixed on the above stationary base 2. The nozzle 7 is connected with a processing water supply means 70 for supplying high-pressure processing water containing abrasive grains.

Next, the CSP substrate as a workpiece to be cut by the afore-mentioned water jet-processing machine will be described with reference to FIG. 2 and FIG. 3.

Figure 2:
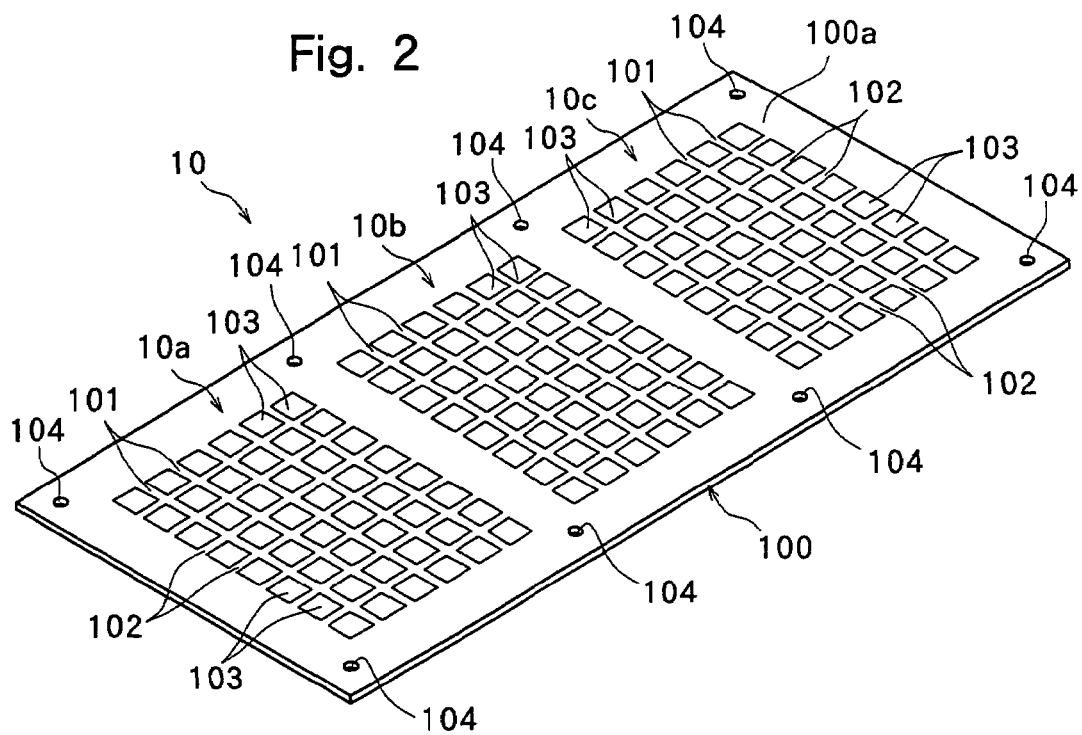
FIG. 2 is a perspective view of a CSP substrate as a workpiece.
Figure 3:
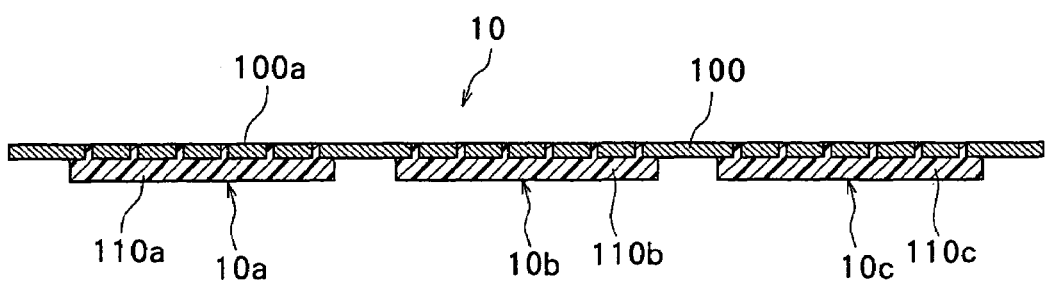
FIG. 3 is a cross-sectional view of the CSP substrate shown in FIG. 2.

In the CSP substrate 10 shown in FIG. 2 and FIG. 3, there are formed three adjoining blocks 10a, 10b and 10c in an electrode plate 100. A plurality of first dividing lines 101 extending in a predetermined direction and a plurality of second dividing lines 102 extending in a direction perpendicular to the first dividing lines 101 are formed in a lattice pattern on the front surface 100a having the three blocks 10a, 10b and 10c constituting the CSP substrate 10. Chip size packages (CSP) 103 are respectively arranged in a plurality of areas sectioned by the first dividing lines 101 and the second dividing lines 102. In the chip size packages (CSP) 103, the blocks 10a, 10b and 10c are respectively molded by synthetic resin portions 110a, 110b and 110c, from the back side of the electrode plate 100. The peripheral portion of the electrode plate 100 constituting the CSP substrate 10 projects outward from the three blocks 10a, 10b and 10c, and a plurality of positioning holes 104 (four on each side in the illustrated embodiment) are formed in the projection portions on both sides in the longitudinal direction. The CSP substrate 10 thus formed is cut along the first dividing lines 101 and the second dividing lines 102 to be divided into individual chip size packages (CSP) 103.

Figure 4:
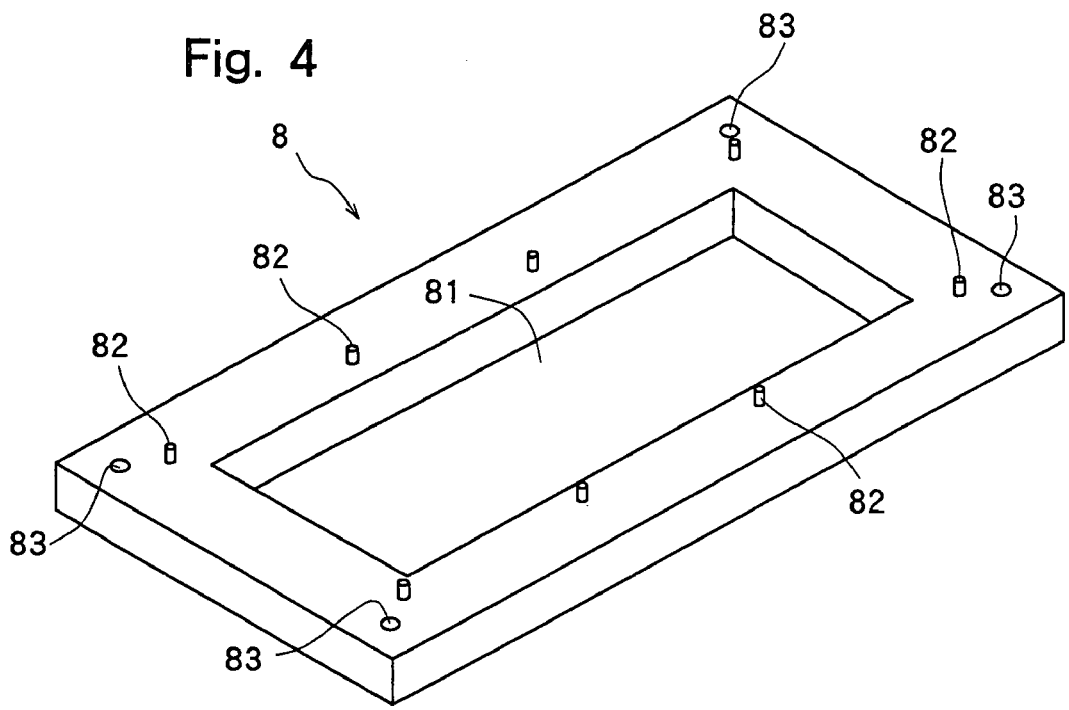
FIG. 4 is a perspective view of a workpiece holding frame for holding the CSP substrate as a workpiece.

The afore-mentioned CSP substrate 10 is held on a workpiece holding frame 8 shown in FIG. 4 and supported onto the above workpiece holding table 6 of the water jet-processing machine by a workpiece holding jig that will be described later. The workpiece holding frame 8 shown in FIG. 4 is a rectangular plate made of a metal or synthetic resin and has an opening 81 to which the three blocks 10a, 10b and 10c of the above CSP substrate 10 are fitted. A plurality of positioning pins 82 to be fitted to the plurality of positioning holes 104 formed in the electrode plate 100 of the above CSP substrate 10 are provided on both sides in the longitudinal direction of the opening 81 of the workpiece holding frame 8. Further, four positioning holes 83 to be fitted to the four positioning pins 62a and 62b provided on the first holding jig mounting portion 6a and the second holding jig mounting portion 6b are formed in the four corners of the workpiece holding frame 8.

A description will be subsequently given of the workpiece holding jig for mounting the CSP substrate 10 held by the above workpiece holding frame 8 on the first holding jig mounting portion 6a or the second holding jig mounting portion 6b of the above workpiece holding table 6. In the illustrated embodiment, the workpiece holding jig comprises a first workpiece holding jig 9a shown in FIGS. 5 to 9 to be mounted on the first holding jig mounting portion 6a and a second workpiece holding jig 9b shown in FIGS. 10 to 14 to be mounted on the second holding jig mounting portion 6b.

The first workpiece holding jig 9a shown in FIGS. 5 to 9 comprises a first holding jig body 90a and a first soft sheet 93a mounted on the top of the first holding jig body 90a.

Figure 5:
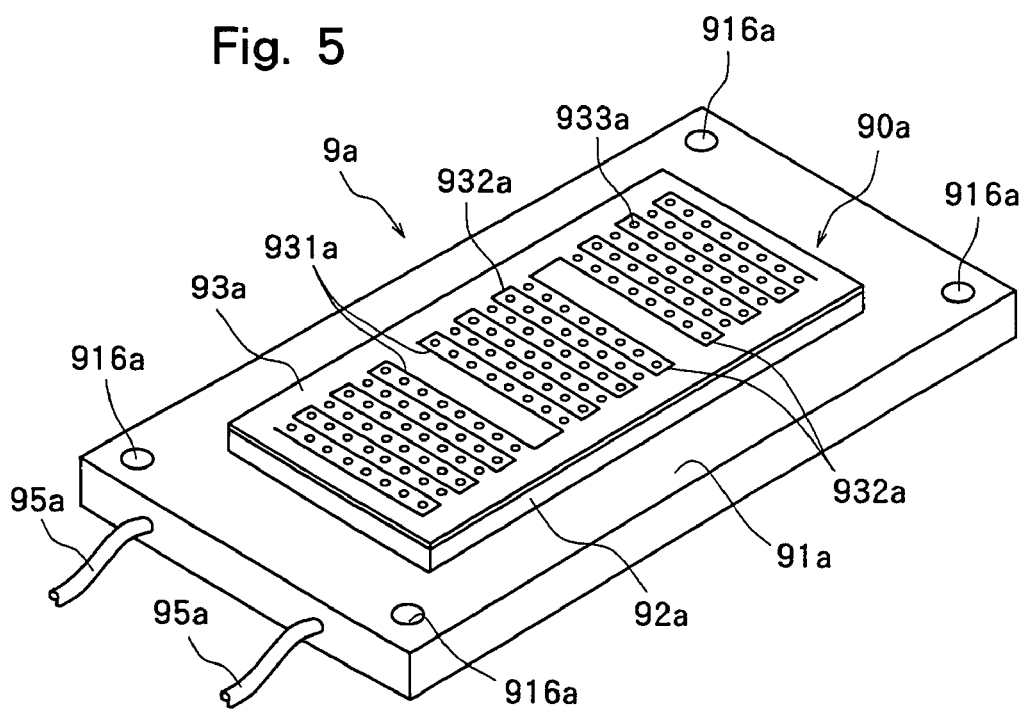
FIG. 5 is a perspective view of a first workpiece holding jig, constituted according to an embodiment of the present invention, for suction-holding the CSP substrate held on the workpiece holding frame shown in FIG. 4.
Figure 6:
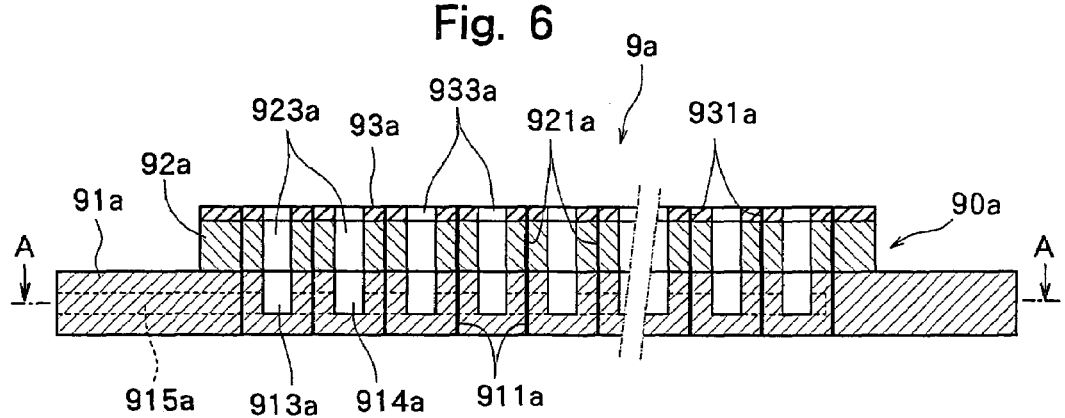
FIG. 6 is a cross-sectional view of the first workpiece holding jig shown in FIG. 5.
Figure 7:
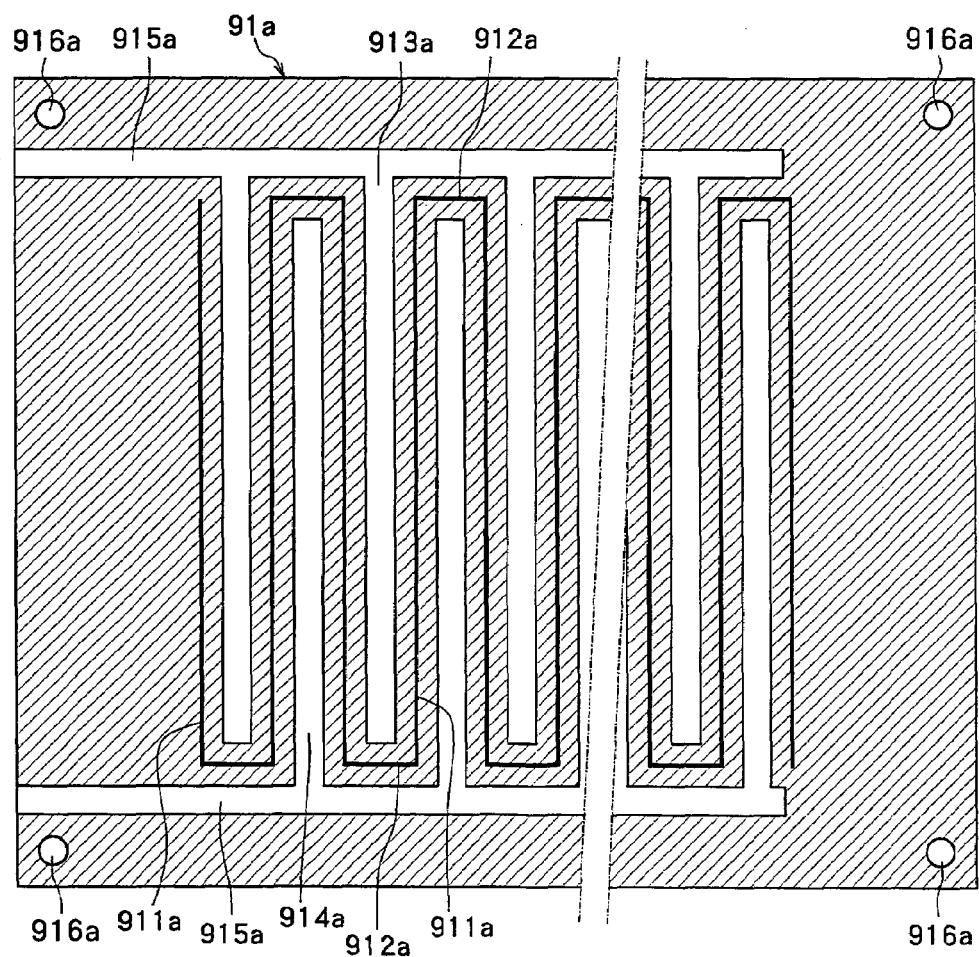
FIG. 7 is a cross-sectional view cut on A-A of FIG. 6.

The first holding jig body 90a consists of a first jig plate 91a and a second jig plate 92a mounted on the first jig plate 91a in the illustrated embodiment. The first jig plate 91a is a rectangular plate made of a metal or synthetic resin as shown in FIG. 7, and first through-grooves 911a corresponding to the first dividing lines 101 of the above CSP substrate 10 and second through-grooves 912a interconnecting adjacent first through-grooves 911a at one end (upper ends in FIG. 7) and the other end (lower ends in FIG. 7) of the first through-grooves 911a alternately are formed on the top of the first jig plate 91a. Further, suction-grooves 913a and 914a which are open at the top are formed alternately between adjacent first through-grooves 911a and 911a (at positions corresponding to areas where the chip size packages (CSP) 103 of the above CSP substrate 10 are formed) in the first jig plate 91a, and suction-passages 915a and 915a extending in the longitudinal direction (horizontal direction in FIG. 7) are formed on the upper and lower sides in FIG. 7 of the suction-grooves 913a and 914b. The upper ends in FIG. 7 of the above suction-grooves 913a are connected to the upper suction-passage 915a and the lower ends in FIG. 7 of the above suction-grooves 914a are connected to the lower suction-passage 915a. The thus formed suction-grooves 913a and 914a and the suction-passages 915a and 915a constitute a suction path connected to suction-holes that will be described later. The suction-grooves 913a and 914a and the suction-passages 915a and 915a constituting the suction path are formed at positions where they do not intersect the above first through-groove 911a and the above second through-groove 912a. The above suction-passages 915a and 915a are connected to suction means (not shown) by suction hoses 95a and 95a as shown in FIG. 5, respectively. Four positioning holes 916a to be fitted to the four positioning pins 62a provided on the first holding jig mounting portion 6a are formed in the four corners of the first jig plate 91a.

Figure 8:
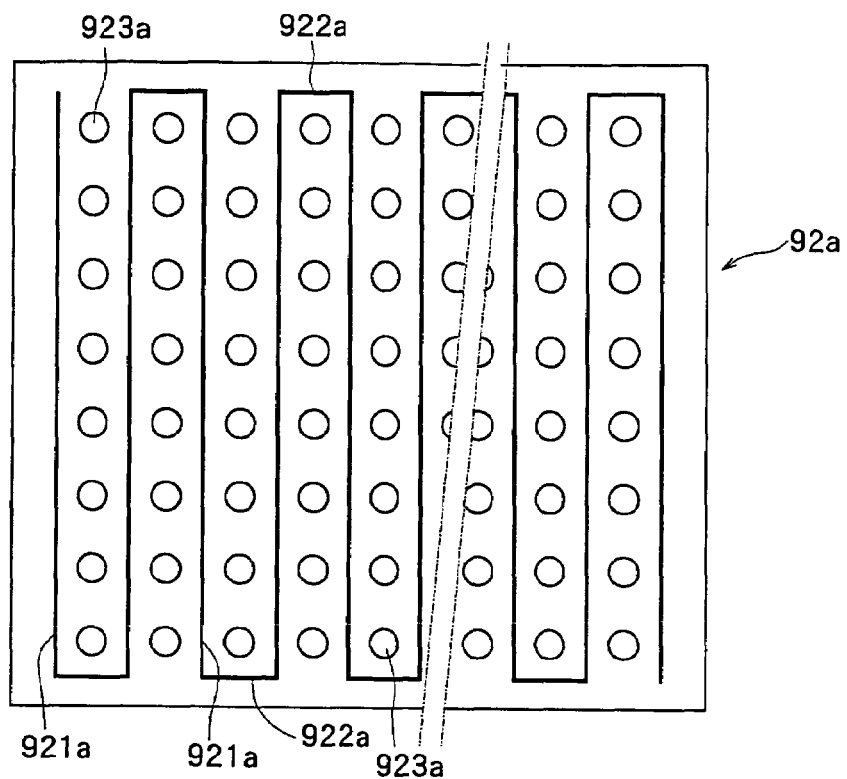
FIG. 8 is a plan view of a second jig plate constituting the first workpiece holding jig shown in FIG. 5.

The above second jig plate 92a is a rectangular plate made of a metal or synthetic resin and formed in size enough to be fitted to the opening 81 of the above workpiece holding frame 8, as shown in FIG. 8. First through-grooves 921a and second through-grooves 922a corresponding to the first through-grooves 911a and the second through-grooves 912a formed in the above first jig plate 91a are formed in the second jig plate 92a, respectively. Further, a plurality of suction-holes 923a connected to the suction-grooves 913a and 914a formed in the first jig plate 91a corresponding to the chip size packages (CSP) 103 of the above CSP substrate 10 are formed between adjacent first through-grooves 921a and 921a in the second jig plate 92a. The thus constituted second jig plate 92a is joined to the top of the first jig plate 91a by an adhesive or fixing means such as fastening bolts.

Figure 9:
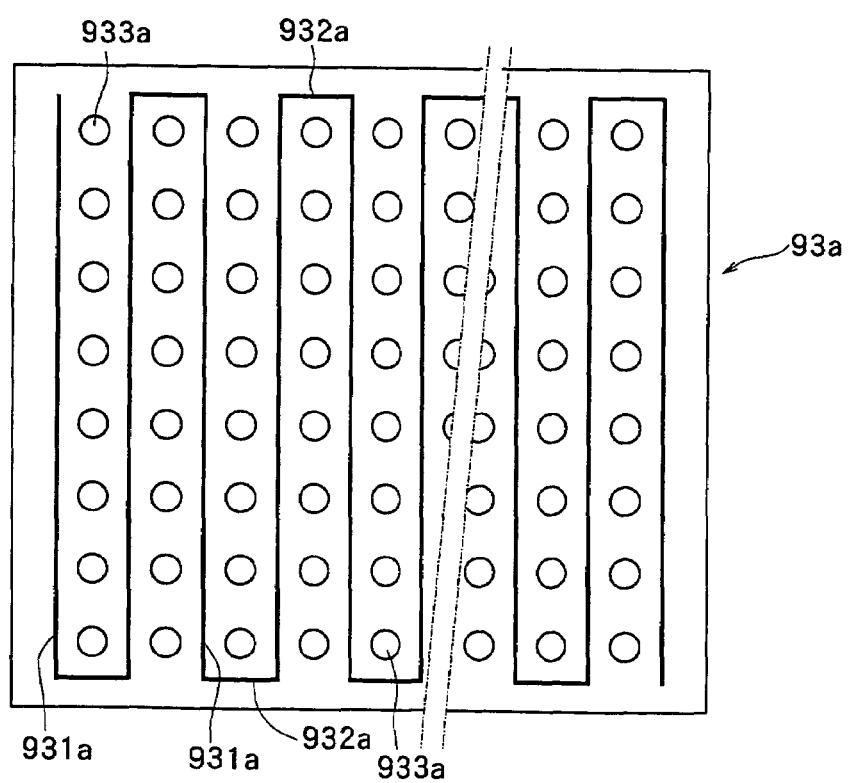
FIG. 9 is a plan view of a first soft sheet constituting the first workpiece holding jig shown in FIG. 5.

The above first soft sheet 93a is made of natural rubber or synthetic rubber and is rectangular in shape as shown in FIG. 9, and first through-grooves 931a and second through-grooves 932a corresponding to the first through-grooves 921a and the second through-grooves 922a formed in the above second jig plate 92a are formed in the first soft sheet 93a, respectively. In the first soft sheet 93a, a plurality of suction-holes 933a corresponding to the plurality of suction-holes 923a formed in the above second jig plate 92a are formed between adjacent first through-grooves 931a and 931a. The thus constituted first soft sheet 93a is bonded to the top of the above second jig plate 92a by an adhesive.

The first workpiece holding jig 9a constituted by the above first jig plate 91a, the second jig plate 92a and the first soft sheet 93a is mounted at a predetermined position of the first holding jig mounting portion 6a of the above workpiece holding table 6. That is, the first workpiece holding jig 9a is mounted on the first holding jig mounting portion 6a by fitting the four positioning holes 916a formed in the first jig plate 91a to the four positioning pins 62a provided on the first holding jig mounting portion 6a of the above workpiece holding table 6. The first through-grooves 911a and the second through-grooves 912a formed in the first jig plate 91a, the first through-grooves 921a and the second through-grooves 922a formed in the second jig plate 92a, and the first through-grooves 931a and the second through-grooves 932a formed in the first soft sheet 93a constituting the first workpiece holding jig 9a maybe formed along the first through-grooves and the second through-grooves by spurting a jet of processing water from the nozzle 7, like in the cutting step which will be described later, in a state where the first workpiece holding jig 9a is mounted on the first holding jig mounting portion 6a of the workpiece holding table 6.

A description will be subsequently given of the second workpiece holding jig 9b with references to FIGS. 10 to 14.

The second workpiece holding jig 9b shown in FIGS. 10 to 14 comprises a second holding jig body 90b and a second soft sheet 93b mounted on the top of the second holding jig body 90b.

Figure 10:
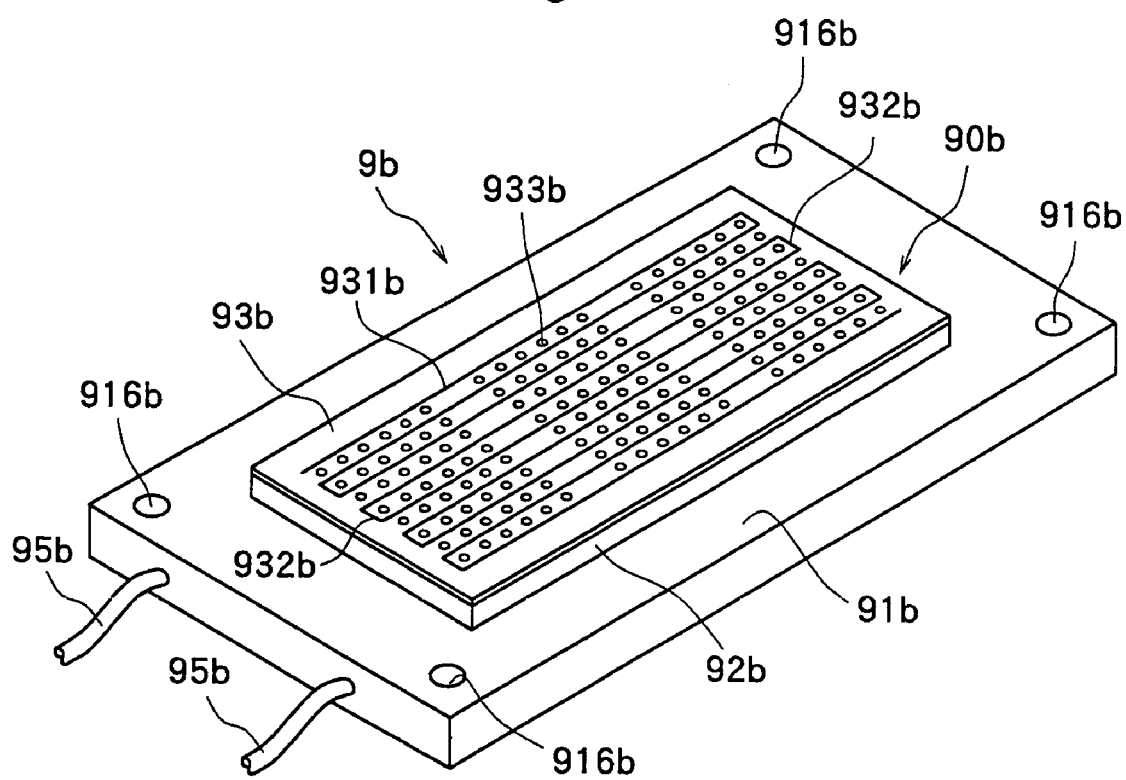
FIG. 10 is a perspective view of a second workpiece holding jig, constituted according to an embodiment of the present invention, for suction-holding the CSP substrate held on the workpiece holding frame shown in FIG. 4.
Figure 11:
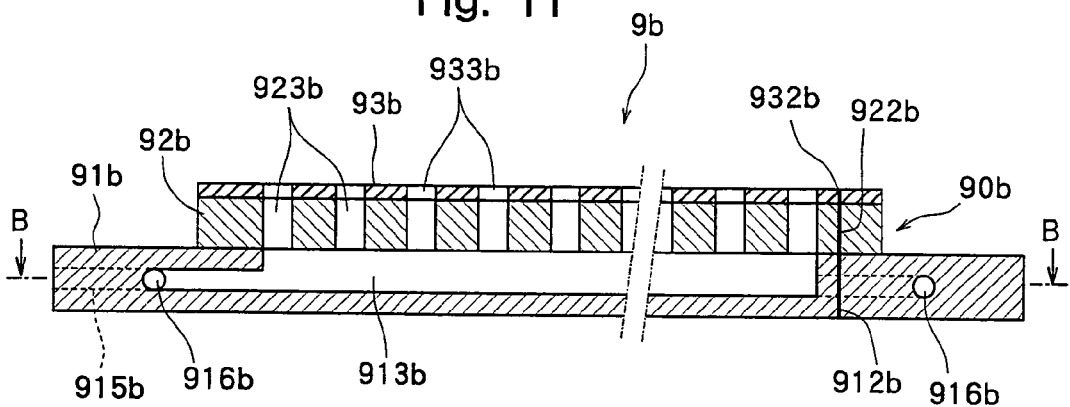
FIG. 11 is a cross-sectional view of the second workpiece holding jig shown in FIG. 10.
Figure 12:
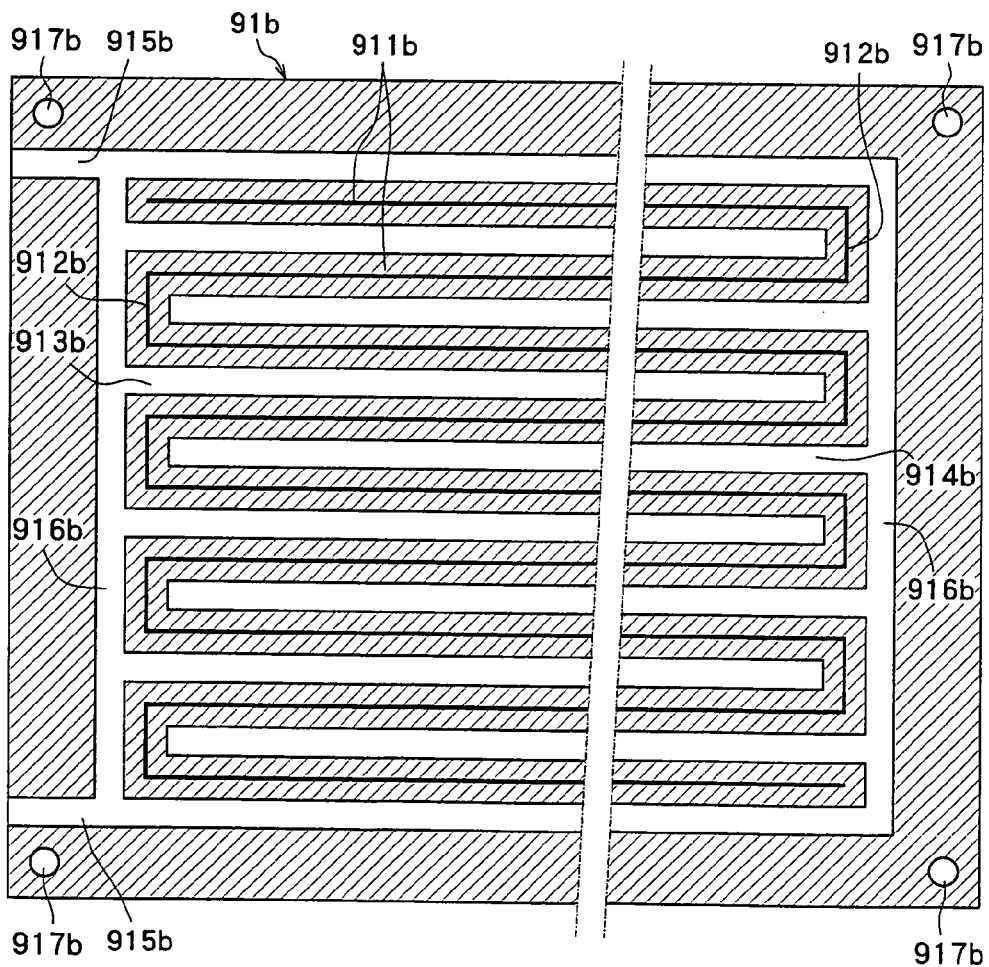
FIG. 12 is a cross-sectional view cut on B-B of FIG. 11.

The second holding jig body 90b consists of a first jig plate 91b and a second jig plate 92b mounted on the first jig plate 91b in the illustrated embodiment. The first jig plate 91b is a rectangular plate made of a metal or synthetic resin as shown in FIG. 12, and first through-grooves 911b corresponding to the second dividing lines 102 of the above CSP substrate 10 and second through-grooves 912b interconnecting adjacent first through-grooves 911b at one ends (left ends in FIG. 12) and the other ends (right ends in FIG. 12) of the first through-grooves 911b alternately are formed on the top of the first jig plate 91b Further, suction-grooves 913b and 914b which are open at the top are formed alternately between adjacent first through-grooves 911b and 911b (at positions corresponding to areas where the chip size packages (CSP) 103 of the above CSP substrate 10 are formed) in the first jig plate 91b, and suction-passages 915b and 915b extending in the longitudinal direction (horizontal direction in FIG. 12) are formed on the upper and lower sides in FIG. 12 of the suction-grooves 913b and 914b and further, suction-passages 916b and 916b communicating with the suction-passages 915b and 915b are formed. The left ends in FIG. 12 of the above suction-grooves 913b are connected to the left suction-passage 916b and the right ends in FIG. 12 of the above suction-grooves 914b are connected to the right suction-passage 916b. The thus formed suction-grooves 913b and 914b and the suction-passages 915b, 915b, 916b and 916b constitute a suction path connected to suction-holes that will be described later. The suction-grooves 913b and 914b and the suction-passages 915b, 915b, 916b and 916b constituting a suction path are formed at positions where they do not intersect the above first through-groove 911b and the above second through-groove 912b. The above suction-passages 915b and 915b are connected to suction means (not shown) by suction hoses 95b and 95b as shown in FIG. 10, respectively. Four positioning holes 917b to be fitted to the four positioning pins 62b provided on the above second holding jig mounting portion 6b are formed in the four corners of the first jig plate 91b.

Figure 13:
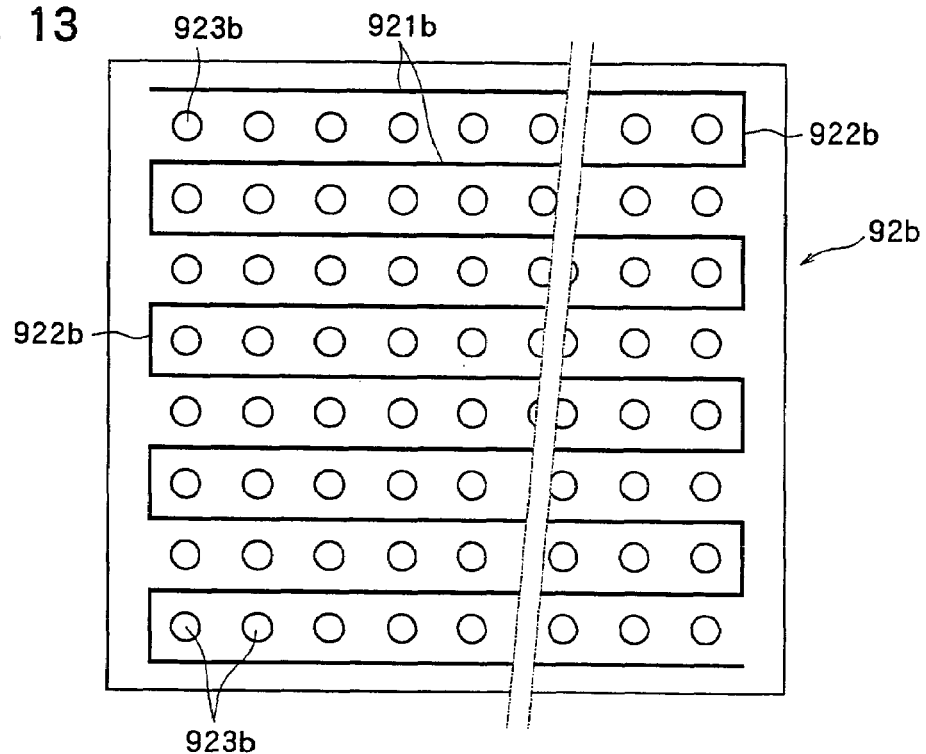
FIG. 13 is a plan view of a second jig plate constituting the second workpiece holding jig shown in FIG. 10.

The above second jig plate 92b is a rectangular plate made of a metal or synthetic resin and is formed in size enough to be fitted to the opening 81 of the above workpiece holding frame 8, as shown in FIG. 13. First through-grooves 921b and second through-grooves 922b corresponding to the first through-grooves 911b and the second through-grooves 912b formed in the above first jig plate 91b are formed in the second jig plate 92b, respectively. Further, a plurality of suction-holes 923b connected to the suction-grooves 913b and 914b formed in the first jig plate 91b corresponding to the chip size packages (CSP) 103 of the above CSP substrate 10 are formed between adjacent first through-grooves 921b and 921b in the second jig plate 92b. The thus constituted second jig plate 92b is joined to the top of the first jig plate 91b by an adhesive or fixing means such as fastening bolts.

Figure 14:
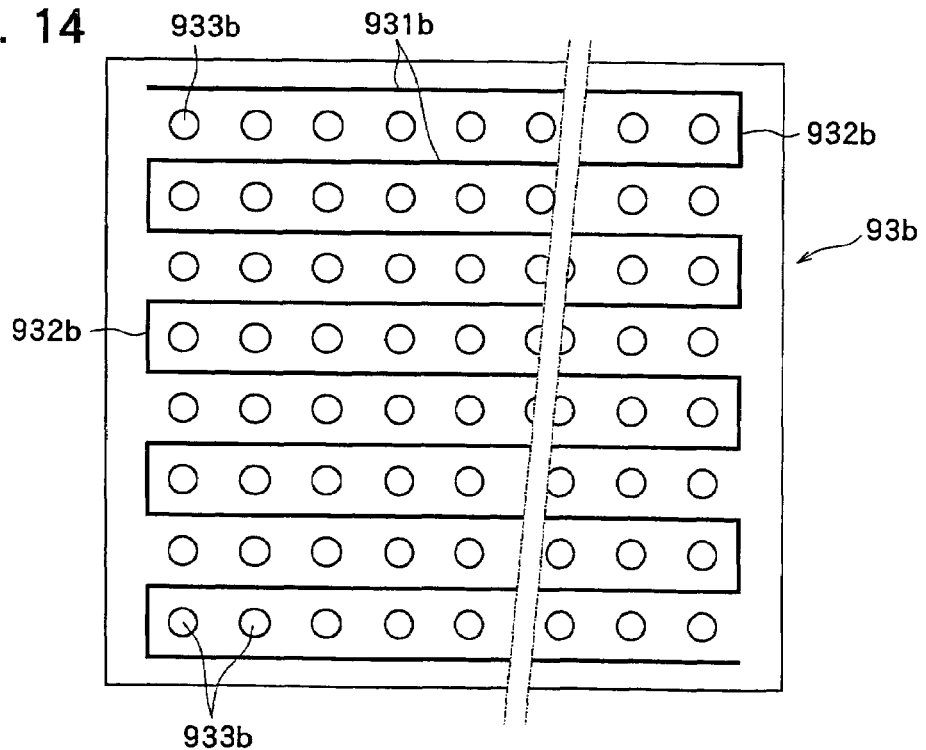
FIG. 14 is a plan view of a second soft sheet constituting the second workpiece holding jig shown in FIG. 10.

The above second soft sheet 93b is made of natural rubber or synthetic rubber and is rectangular in shape as shown in FIG. 14, and first through-grooves 931b and second through-grooves 932b corresponding to the first through-grooves 921b and the second through-grooves 922b formed in the above second jig plate 92b are formed in the second soft sheet 93b, respectively. In the second soft sheet 93b, a plurality of suction-holes 933b corresponding to the plurality of suction-holes 923b formed in the above second jig plate 92b are formed between adjacent first through-grooves 931b and 931b The thus constituted second soft sheet 93b is bonded to the top of the above second jig plate 92b by an adhesive.

The second workpiece holding jig 9b constituted by the above-mentioned first jig plate 91b, second jig plate 92b and second soft sheet 93b is mounted at a predetermined position of the second holding jig mounting portion 6b of the above workpiece holding table 6. That is, the second workpiece holding jig 9b is mounted on the second holding jig mounting portion 6b by fitting the four positioning holes 917b formed in the first jig plate 91b to the four positioning pins 62b provided on the second holding jig mounting portion 6b of the above workpiece holding table 6. The first through-grooves 911b and the second through-grooves 912b formed in the first jig plate 91b, the first through-grooves 921b and the second through-grooves 922b formed in the second jig plate 92b, and the first through-grooves 931b and the second through-grooves 932b formed in the second soft sheet 93b constituting the second workpiece holding jig 9b may be formed along the first through-grooves and the second through-grooves by spurting a jet of processing water from the nozzle 7, like in the cutting step that will be described later, in a state where the second workpiece holding jig 9b is mounted on the second holding jig mounting portion 6b of the workpiece holding table 6.

The water jet-processing machine in the illustrated embodiment is constituted as described above, and its function will be described hereinunder.

Figure 15:
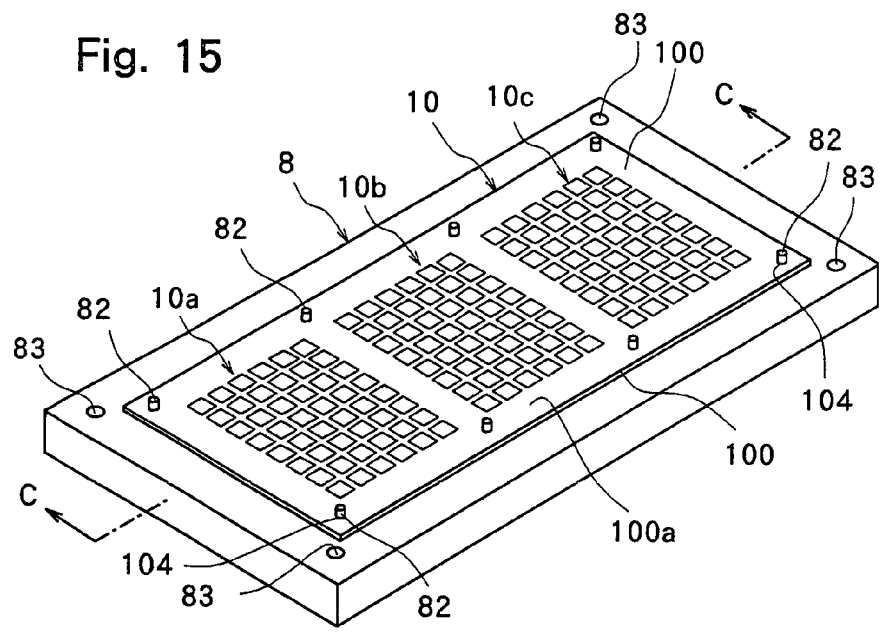
FIG. 15 is a perspective view showing a state where the CSP substrate as the workpiece is held on the workpiece holding frame.
Figure 16:
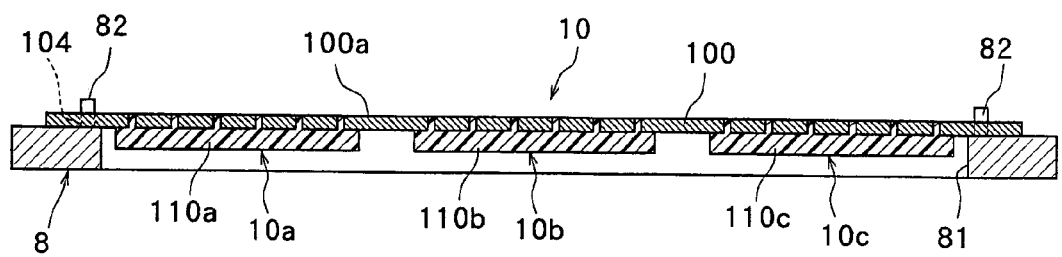
FIG. 16 is a cross-sectional view cut on C-C of FIG. 15.

To cut the above CSP substrate 10 along the first dividing lines 101 and the second dividing lines 102 with the above-described water jet-processing machine, the CSP substrate 10 is first set on the top of the above workpiece holding frame 8. That is, as shown in FIG. 15 and FIG. 16, the CSP substrate 10 is held on the workpiece holding frame 8 by fitting the positioning holes 104 formed in the electrode plate 100 of the CSP substrate 10 to the positioning pins 82 provided on the workpiece holding frame 8 and putting the synthetic resin portions 110a, 110b and 110c of the three blocks 10a, 10b and 10c in the opening 81 formed in the workpiece holding frame 8.

Figure 17:
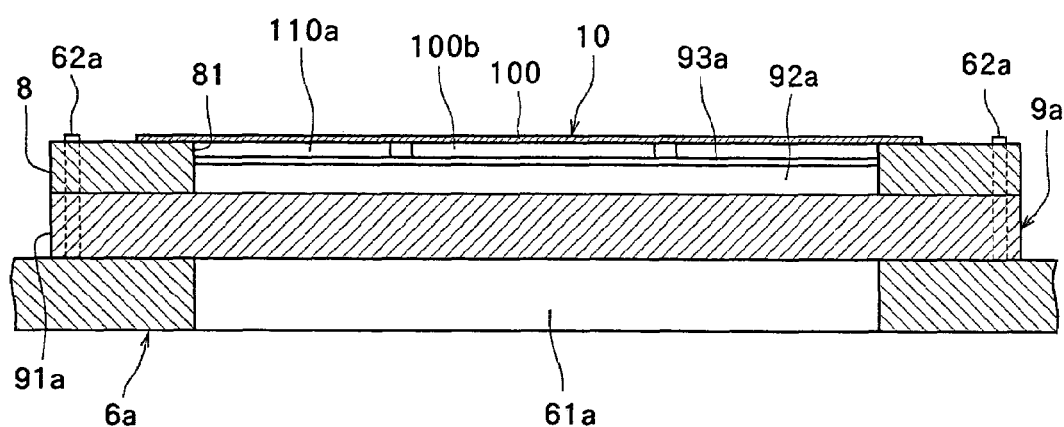
FIG. 17 is a cross-sectional view showing a state where the CSP substrate held by means of the workpiece holding frame is held on the first workpiece holding jig set on the first holding jig mounting portion of a workpiece holding table constituting the water jet-processing machine shown in FIG. 1.

The workpiece holding frame 8 holding the CSP substrate 10 is placed on the first workpiece holding jig 9a mounted on the first holding jig mounting portion 6a of the workpiece holding table 6 of the water jet-processing machine shown in FIG. 1. At this point, the workpiece holding frame 8 holding the CSP substrate 10 is held at a predetermined position of the first workpiece holding jig 9a by fitting the four positioning holes 83 formed in the workpiece holding frame 8 to the four positioning pins 62a provided on the first holding jig mounting portion 6a of the workpiece holding table 6. As a result, as shown in FIG. 17, the opening 81 of the workpiece holding frame 8 is fitted to the second jig plate 92a constituting the first workpiece holding jig 9a, and the synthetic resin portions 110a, 110b and 110c of the three blocks 10a, 10b and 10c constituting the CSP substrate 10 held on the workpiece holding frame 8 are placed on the first soft sheet 93a mounted on the top of the second jig plate 92a.

After the workpiece holding frame 8 holding the CSP substrate 10 is set at the predetermined position of the first workpiece holding jig 9a as described above, the suction means (not shown) is activated to exert negative pressure on the suction-grooves 913a and 914a through the suction hoses 95a and 95a and the suction-passages 915a and 915a formed in the first jig plate 91a. As a result, negative pressure acts on the undersurfaces of the chip size packages (CSP) 103 of the CSP substrate 10 through the plurality of suction-holes 923a which are formed in the second jig plate 92a and communicate with the suction-grooves 913a and 914a and through the plurality of suction-holes 933a which are formed in the first soft sheet 93a and communicate with the suction-grooves 913a and 914a, whereby the CSP substrate 10 is suction-held on the first soft sheet 93a of the first workpiece holding jig 9a.

Figure 18:
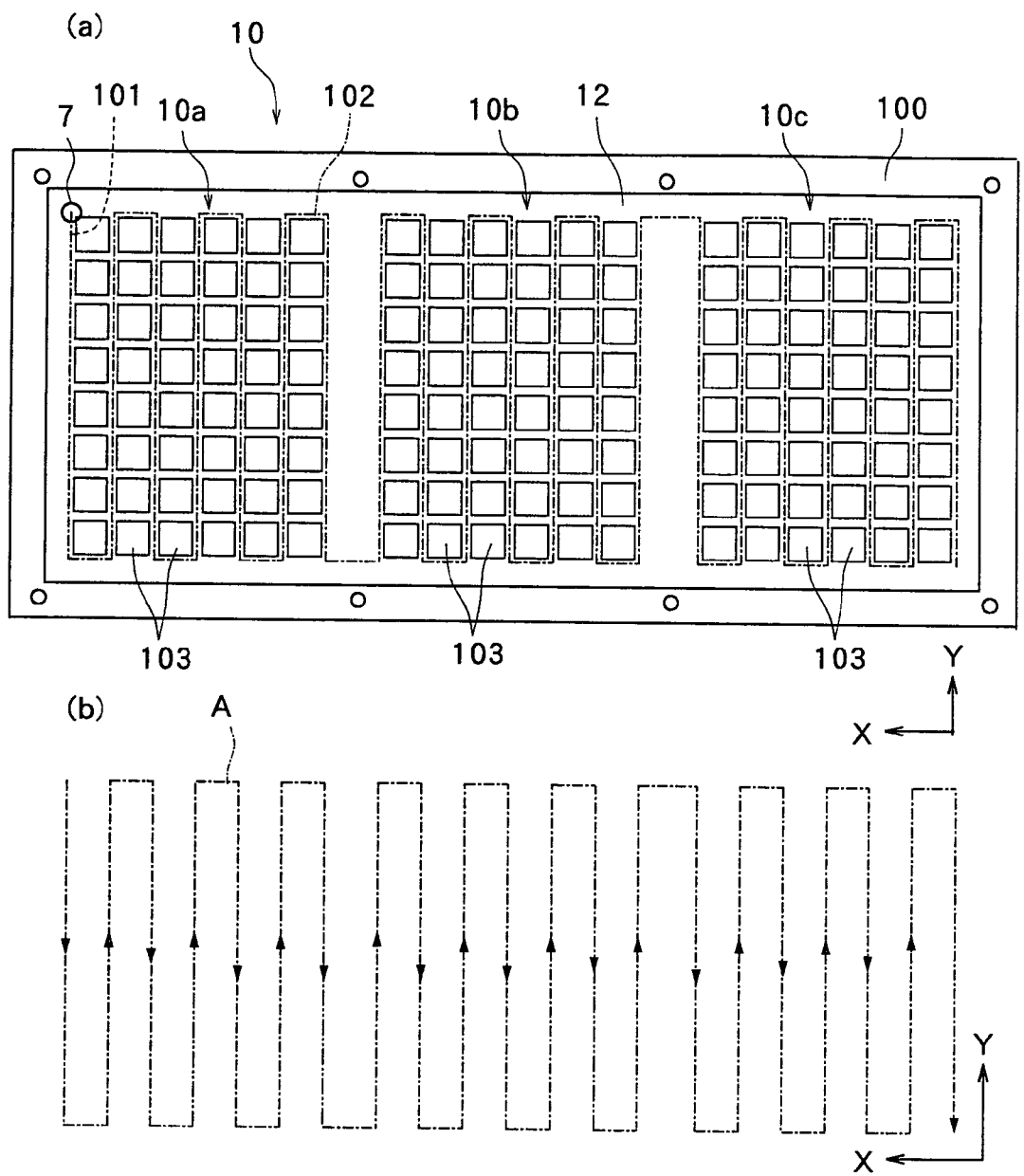
FIGS. 18(a) and 18(b) are diagrams showing a first cutting step for cutting the CSP substrate by the water jet-processing machine shown in FIG. 1.

After the CSP substrate 10 is suction-held on the first soft sheet 93a of the first workpiece holding jig 9a mounted on the first holding jig mounting portion 6a of the workpiece holding table 6, the first moving means 30 and the third moving means 50 are activated to move the first movable base 3 and the third movable base 5 in the directions indicated by the arrow X and the arrow Y, respectively, so as to move the CSP substrate 10 held on the workpiece holding table 6 to the processing area below the nozzle 7. As shown in FIG. 18(a), one end (upper end in FIG. 18(a)) of a first dividing line 101 at a position where the first dividing line 101 and the second dividing line 102 at the left corner in FIG. 18(a) of the block 10a forming the CSP substrate 10 cross each other, that is, one end of the first dividing line 101 on the outermost side (the most left side in FIG. 18(a)) is aligned with the nozzle 7. The second moving means 40 is then activated to move the second movable base 4 in the direction indicated by the arrow Z so as to bring the nozzle 7 to a position with a predetermined distance (for example, 50 μm) above from the surface of the CSP substrate 10.

Thereafter, the processing water supply means 70 is activated to spurt a jet of processing water containing abrasive grains from the nozzle 7, and the third moving means 50 and the first moving means 30 are activated to move the third movable base 5 and the first movable base 3 in the directions indicated by the arrows Y and X sequentially, respectively, so as to move the workpiece holding table 6, that is, the CSP substrate 10, relative to the nozzle 7 along the first dividing lines 101 and part of the second dividing lines 102 as shown by a one-dot chain line in FIG. 18(a) (corresponding to the first through-grooves 931a and the second through-grooves 932a formed in the first soft sheet 93a, the first through-grooves 921a and the second through-grooves 922a formed in the second jig plate 92a, and the first through-grooves 911a and the second through-grooves 912a formed in the first jig plate 91a), that is, to move the CSP substrate 10 relative to the nozzle 7 in the directions indicated by the arrows Y and X successively as indicated by the arrow A in the FIG. 18(b). In the illustrated embodiment, the CSP substrate 10 is moved relative to the nozzle 7 from one end (upper end in FIG. 18(a)) toward the other end (lower end in FIG. 18(a)) of a first dividing line 101, and when the other end of the first dividing line 101 is reached, the CSP substrate 10 is moved relative to nozzle 7 along the second dividing line 102 toward the other end of the next first dividing line 101 in the right direction in FIG. 18(a) and further from the other end toward one end of the first dividing line 101. When the one end of the first dividing line 101 is reached, the CSP substrate 10 is moved relative to nozzle 7 along the second dividing line 102 to one end of the further next first dividing line 101 in the right direction in FIG. 18(a), and the above relative movement is repeated successively. As data of the intervals, lengths, etc. of the first dividing lines 101 and the second dividing lines 102 are stored in advance in the memory of the control means (not shown), this movement is carried out by controlling the above third moving means 50 and the first moving means 30 through the control means based on the stored data.

As a result, the three blocks 10a, 10b and 10c forming the CSP substrate 10 are cut along all the first dividing lines 101 and part of the second dividing lines 102, as shown by the one-dot chain line of FIG. 18(a) (first cutting step). Thus, the CSP substrate 10 can be cut along all the first dividing lines 101 and part of the second dividing lines 102 without suspending the spurting of a jet of processing water from the nozzle 7 by moving the CSP substrate 10 relative to the nozzle 7 as shown by the one-dot chain line in FIG. 18(a). In this connection, when the CSP substrate 10 is cut as shown by the one-dot chain line in FIG. 18(a), cut portions tend to curve and turn up. However, in the illustrated embodiment, as the CSP substrate 10 is suction-held on the first soft sheet 93a of the first workpiece holding jig 9a as described above, the CSP substrate 10 is prevented from curving. At the time of cutting, a jet of water penetrates the CSP substrate 10 and discharged into the water tank 60 through the first through-grooves 931a and the second through-grooves 932a formed in the first soft sheet 93a, the first through-grooves 921a and the second through-grooves 922a formed in the second jig plate 92a, and the first through-grooves 911a and the second through-grooves 912a formed in the first jig plate 91a. The power of the jet of water is weakened by buffer water contained in the water tank 60.

After the CSP substrate 10 is cut as shown by the one-dot chain line in FIG. 18(a) by carrying out the above first cutting step, the suction-holding of the CSP substrate 10 is canceled, and the workpiece holding frame 8 holding the CSP substrate 10 is taken off from the first workpiece holding jig 9a mounted on the first holding jig mounting portion 6a of the workpiece holding table 6 of the water jet-processing machine. Subsequently, the workpiece holding frame 8 holding the CSP substrate 10 is placed on the second workpiece holding jig 9b mounted on the second holding jig mounting portion 6b of the workpiece holding table 6. At this point, the workpiece holding frame 8 holding the CSP substrate 10 is held at a predetermined position of the second workpiece holding jig 9b by fitting the four positioning holes 83 formed in the workpiece holding frame 8 to the four positioning pins 62b provided on the second holding jig mounting portion 6b of the workpiece holding table 6. The suction means (not shown) is then activated to apply negative pressure to the suction-grooves 913b and 914b through the suction hoses 95b and 95b and the suction-passages 915b, 915b, 916b and 916b formed in the first jig plate 91b As a result, negative pressure acts on the undersurfaces of the chip size packages (CSP) 103 of the CSP substrate 10 through the plurality of suction-holes 923b that are formed in the second jig plate 92b and communicate with the suction-grooves 913a and 914a and through the plurality of suction-holes 933b that are formed in the second soft sheet 93b and communicate with the suction-grooves 913a and 914a, whereby the CSP substrate 10 is suction-held on the second soft sheet 93b of the second workpiece holding jig 9b.

Figure 19:
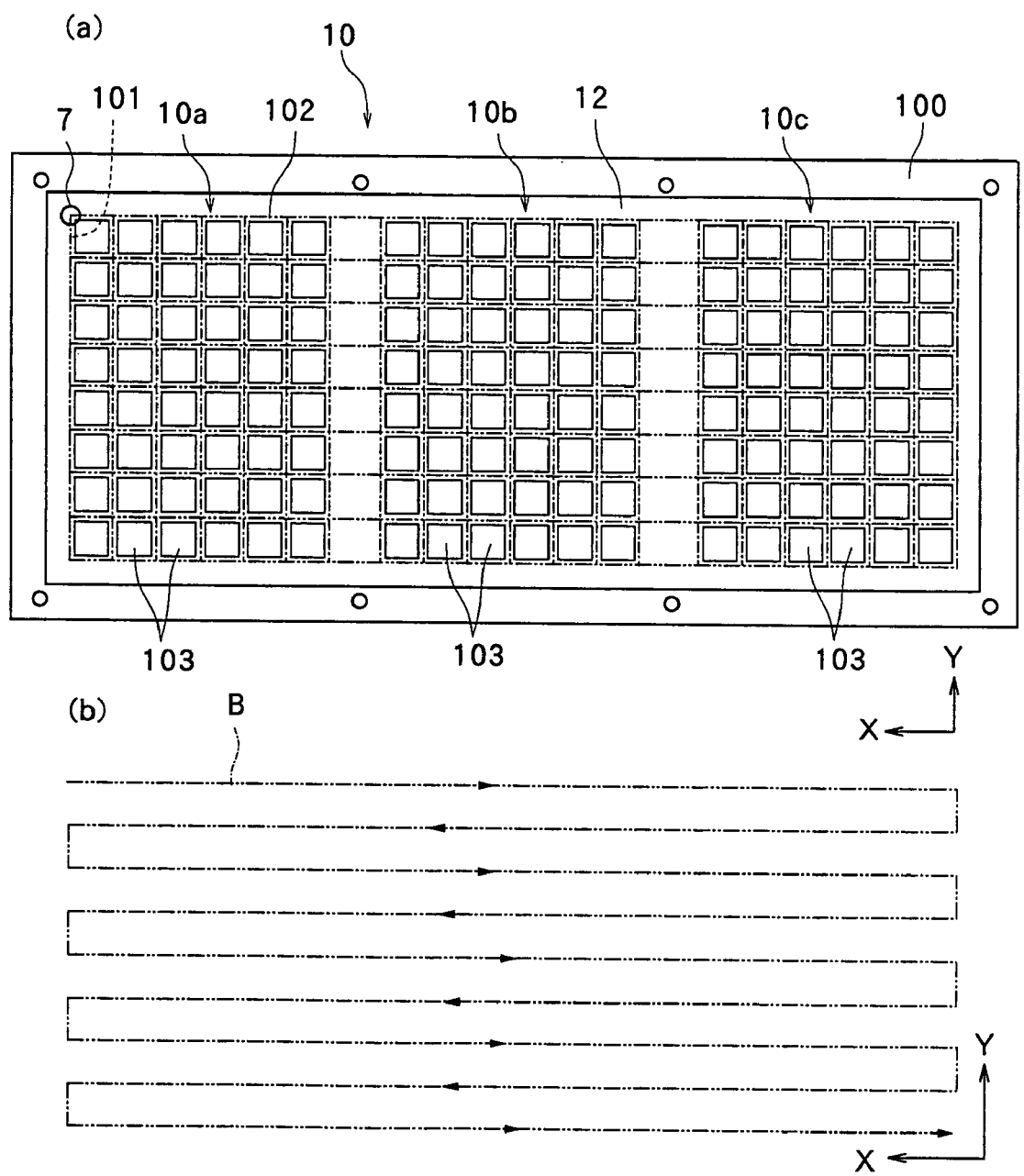
FIGS. 19(a) and 19(b) are diagrams showing a second cutting step for cutting the CSP substrate by the water jet-processing machine shown in FIG. 1.

After the CSP substrate 10 is suction-held on the second soft sheet 93b of the second workpiece holding jig 9b mounted on the second holding jig mounting portion 6b of the workpiece holding table 6, the first moving means 30 and the third moving means 50 are activated to move the first movable base 3 and the third movable base 5 in the directions indicated by the arrows X and Y, respectively, to align the nozzle 7 with one end (left end in FIG. 19(a)) of the second dividing line 102 at a position where the first dividing line 101 and the second dividing line 102 at the left corner in FIG. 19(a) of the block 10a forming the CSP substrate 10 cross each other, that is, one end of the second dividing line 102 on the outermost side (the uppermost side in FIG. 19(a)). The second moving means 40 is then activated to move the second movable base 4 in the direction indicated by the arrow Z so as to bring the nozzle 7 to a position with a predetermined distance (for example, 50 μm) above from the surface of the CSP substrate 10.

Thereafter, the processing water supply means 70 is activated to spurt a jet of processing water containing abrasive grains from the nozzle 7, and the first moving means 30 and the third moving means 50 are activated to move the first movable base 3 and the third movable base 5 in the directions indicated by the arrow X and the arrow Y successively, respectively, so that the workpiece holding table 6, that is, the CSP substrate 10 is moved relative to the nozzle 7 along the second dividing lines 102 and part of the first dividing lines 101 as shown by a two-dot chain line in FIG. 19(a) (corresponding to the first through-grooves 931b and the second through-grooves 932b formed in the second soft sheet 93b, the first through-grooves 921b and the second through-grooves 922b formed in the second jig plate 92b, and the first through-grooves 911b and the second through-grooves 912b formed in the first jig plate 91b), that is, the CSP substrate 10 is moved relative to the nozzle 7 in the directions indicated by the arrows X and Y successively as indicated by the arrow B in the FIG. 19(b). In the illustrated embodiment, the CSP substrate 10 is moved relative to the nozzle 7 from one end (left end in FIG. 19(a)) toward the other end (right end in FIG. 19(a)) of a second dividing line 102, and when the other end of the second dividing line 102 is reached, the CSP substrate 10 is moved relative to nozzle 7 along the first dividing line 101 to the other end of the next second dividing line 102 in the downward direction in FIG. 19(a) and further from the other end toward one end of the second dividing line 102. When the one end of the second dividing line 102 is reached, the CSP substrate 10 is moved along the first dividing line 101 to one end of the further next second dividing line 102 in the downward direction in FIG. 19(a), and the above relative movement is repeated successively. This movement is carried out by controlling the above third moving means 50 and the first moving means 30 by means of the control means (not shown) based on data on the intervals, lengths, etc. of the first dividing lines 101 and the second dividing lines 102 stored in the memory of the control means.

As a result, the three blocks 10a, 10b and 10c forming the CSP substrate 10 are cut along all the second dividing lines 102 and part of the first dividing lines 102, as shown by the two-dot chain line of FIG. 19(a) (second cutting step). As shown by the two-dot chain line in FIG. 19(a), the CSP substrate 10 can be cut along all the second dividing lines 102 and part of the first dividing lines 101 without suspending the spurting of a jet of processing water from the nozzle 7 by moving the CSP substrate 10 relative to the nozzle 7 as shown by the two-dot chain line in FIG. 19(a). At the time of cutting, a jet of water penetrates the CSP substrate 10 and is discharged into the water tank 60 through the first through-grooves 931b and the second through-grooves 932b formed in the second soft sheet 93b, the first through-grooves 921b and the second through-grooves 922b formed in the second jig plate 92b, and the first through-grooves 911b and the second through-grooves 912b formed in the first jig plate 91b The power of the jet of water is weakened by buffer water contained in the water tank 60.

As described above, the three blocks 10a, 10b and 10c forming the CSP substrate 10 are divided along the first dividing lines 101 and the second dividing lines 102 as shown by the one-dot chain line and the two-dot chain line in FIG. 18(a) and FIG. 19(a) to be divided into individual chip size packages (CSP) 103. Even when the CSP substrate 10 is thus divided into individual chip size packages (CSP) 103, as the chip size packages (CSP) 103 are suction-held on the second soft sheet 93b of the second workpiece holding jig 9b as described above, they do not fall into pieces and the subsequent conveyance can be easily done.

A description will be subsequently given of a first workpiece holding jig 9a and a second workpiece holding jig 9b according to another embodiment of the present invention with reference to FIG. 20 and FIG. 21. In the embodiment shown in FIG. 20 and FIG. 21, the same constituent members as those of the first workpiece holding jig 9a and the second workpiece holding jig 9b shown in FIGS. 5 to 9 and FIGS. 10 to 14 are given the same reference symbols, and the detailed descriptions thereof are omitted.

Figure 20:
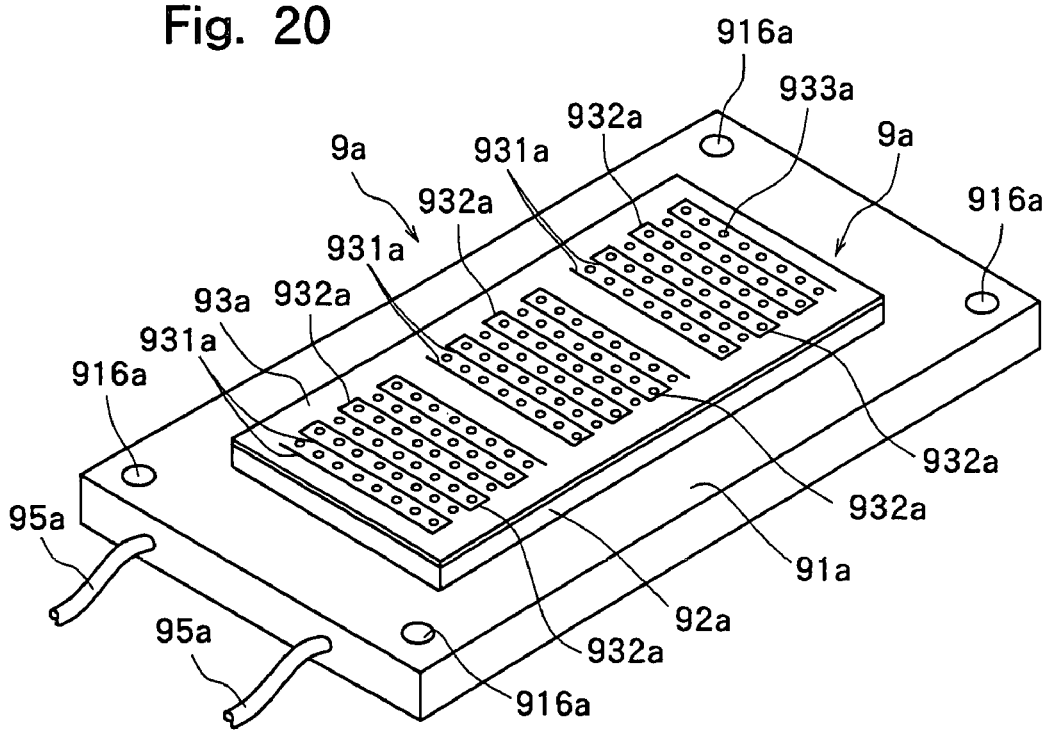
FIG. 20 is a perspective view of a first workpiece holding jig, constituted according to another embodiment of the present invention, for suction-holding the CSP substrate held on the workpiece holding frame shown in FIG. 4.

In the first workpiece holding jig 9a shown in FIG. 20, the first through-grooves 911a and the second through-grooves 912a formed in the first jig plate 91a, the first through-grooves 921a and the second through-grooves 922a formed in the second jig plate 92a, and the first through-grooves 931a and the second through-grooves 932a formed in the first soft sheet 93a are formed separately in each of the three blocks 10a, 10b and 10c forming the CSP substrate 10. In FIG. 20, the first through-grooves 911a and the second through-grooves 912a formed in the first jig plate 91a and the first through-grooves 921a and the second through-grooves 922a formed in the second jig plate 92a are not shown but they are formed correspondingly to the first through-grooves 931a and the second through-grooves 932a formed in the first soft sheet 93a, respectively.

Figure 21:
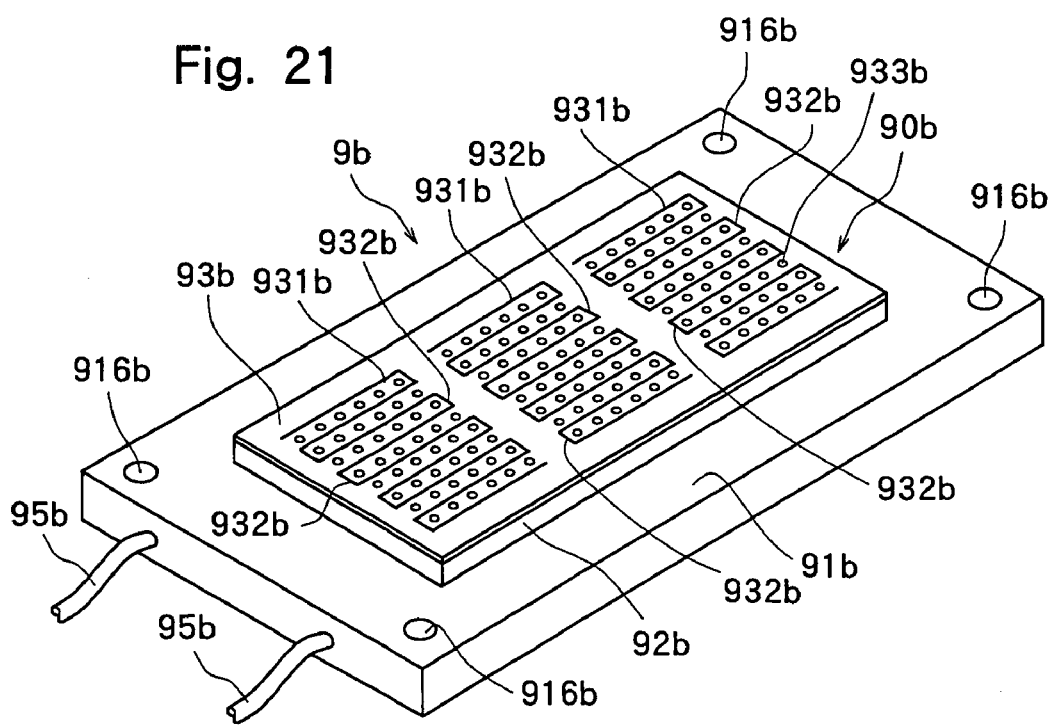
FIG. 21 is a perspective view of a second workpiece holding jig, constituted according to another embodiment of the present invention, for suction-holding the CSP substrate on the workpiece holding frame shown in FIG. 4.

Also in the second workpiece holding jig 9b shown in FIG. 21, the first through-grooves 911b and the second through-grooves 912b formed in the first jig plate 91b, the first through-grooves 921b and the second through-grooves 922b formed in the second jig plate 92b, and the first through-grooves 931b and the second through-grooves 932b formed in the second soft sheet 93b are formed separately in each of the three blocks 10a, 10b and 10c forming the CSP substrate 10, like the first workpiece holding jig 9*a* shown in FIG. 20. In FIG. 21, the first through-grooves 911*b* and the second through-grooves 912*b* formed in the first jig plate 91*b* and the first through-grooves 921*b* and the second through-grooves 922*b* formed in the second jig plate 92*b* are not shown but they are formed correspondingly to the first through-grooves 931*b* and the second through-grooves 932*b* formed in the second soft sheet 93*b*, respectively.

When water jet processing is carried out with the first workpiece holding jig 9*a* and the second workpiece holding jig 9*b* shown in FIG. 20 and FIG. 21, the three blocks 10*a*, 10*b* and 10*c* forming the CSP substrate 10 can be cut simultaneously by using three nozzles.

In the above embodiment, the workpiece holding table 6 has the first holding jig mounting portion 6*a* and the second holding jig mounting portion 6*b*. The workpiece holding table 6 may have either one of these holding jig mounting portions. In the above embodiment, the first workpiece holding jig 9*a* and the second workpiece holding jig 9*b* are provided as the workpiece holding jigs. Either one of the workpiece holding jigs may be provided. In this case, although other workpiece holding jig may be used to carry out the first cutting step, the first workpiece holding jig 9*a* or the second workpiece holding jig 9*b* is used to prevent the individual chip size packages (CSP) 103 from falling apart when the second cutting step is carried out. In the above embodiment, the workpiece holding jig constituted according to the present invention is applied to the water jet-processing machine. When the workpiece holding jig of the present invention is applied to a laser beam processing machine, the same effect and function are obtained.

What is claimed is:

1. A workpiece holding jig for holding a workpiece having a plurality of first dividing lines extending in a predetermined direction and a plurality of second dividing lines formed in a direction intersecting the plurality of first dividing lines, said workpiece holding jig comprising:

a holding jig body; and a soft sheet mounted on top of the holding jig body, wherein the holding jig body has a plurality of first linear through-grooves corresponding to the plurality of first dividing lines and a plurality of second linear through-grooves corresponding to the plurality of second dividing lines, the first linear through-grooves have upper ends and lower ends, the second linear through-grooves include upper through-grooves that connect the upper ends of one pair of adjacent first linear through-grooves, and lower through-grooves that connect the lower ends of another pair of adjacent first linear through-grooves, a plurality of suction-holes are formed in the soft sheet at positions corresponding to a plurality of areas sectioned by the plurality of first dividing lines and the plurality of second dividing lines, and suction-passages are formed in the holding jig body, the suction passages being connected to the plurality of suction-holes but not intersecting with either the first through-grooves or the second through-grooves.

2. The workpiece holding jig according to claim 1, wherein the holding jig body consists of a first jig plate and a second jig plate mounted on the top of the first jig plate, the suction-passages are formed in the first jig plate, and a plurality of suction-holes communicating with the suction-passages formed in the first jig plate and with the plurality of suction-holes formed in the soft sheet are formed in the second jig plate.

3. The workpiece holding jig according to claim 1, wherein the suction passages do not intersect the first and second through-grooves.

4. The workpiece holding jig according to claim 1, wherein the suction passages connect to a suction means by suction hoses.

5. The workpiece holding jig according to claim 1, and further comprising a plurality of positioning holes in the holding jig body.

* * * * *